(12) United States Patent
Hosoe (10) Patent No.: US 8,902,687 B2
(45) Date of Patent: Dec. 2, 2014

(54) SEMICONDUCTOR DEVICE ENABLING REFRESHING OF REDUNDANT MEMORY CELL INSTEAD OF DEFECTIVE MEMORY CELL

(75) Inventor: Yuki Hosoe, Chuo-ku (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 77 days.

(21) Appl. No.: 13/040,407

(22) Filed: Mar. 4, 2011

(65) Prior Publication Data

US 2011/0216614 A1 Sep. 8, 2011

(30) Foreign Application Priority Data

Mar. 5, 2010 (JP) .................................. 2010-048818

(51) Int. Cl.
*G11C 29/00* (2006.01)
*G11C 29/04* (2006.01)

(52) U.S. Cl.
CPC .................................... *G11C 29/04* (2013.01)
USPC .... 365/222; 365/200; 365/230.03; 365/225.7

(58) Field of Classification Search
CPC ..... G11C 11/0605; G11C 17/18; G11C 5/147
USPC ................... 365/200, 230.03, 210.1
See application file for complete search history.

(56) References Cited

U.S. PATENT DOCUMENTS

| 5,818,792 | A | * | 10/1998 | Sasaki et al. | 365/230.08 |
| 6,331,956 | B1 | * | 12/2001 | Ooishi et al. | 365/200 |
| 6,532,181 | B2 | * | 3/2003 | Saito et al. | 365/200 |
| 6,668,345 | B1 | * | 12/2003 | Ooishi et al. | 714/710 |
| 7,251,173 | B2 | * | 7/2007 | Lunde et al. | 365/200 |
| 2008/0137463 | A1 | * | 6/2008 | Ishikawa | 365/222 |
| 2008/0279018 | A1 | * | 11/2008 | Yoon | 365/189.07 |

FOREIGN PATENT DOCUMENTS

| JP | H-785690 A | 3/1995 |
| JP | 11-144492 A | 5/1999 |
| JP | H-11328992 A | 11/1999 |
| JP | 11-353893 A | 12/1999 |
| JP | 2003-187578 A | 7/2003 |
| JP | 2008-165847 A | 7/2008 |

* cited by examiner

Primary Examiner — Son Dinh
Assistant Examiner — Uyen B Tran
(74) Attorney, Agent, or Firm — Sughrue Mion, PLLC (57) ABSTRACT

A semiconductor device includes memory blocks MB1 and MB2 and redundancy determination circuit 25 that can enter a normal operation mode that accesses either memory block MB1 or memory block MB2 and a refresh mode that simultaneously accesses both memory block MB1 and memory block MB2. In response to normal memory cell NMC that belongs to at least one of memory blocks MB1 and MB2 being replaced by redundant memory cell RMC in the refresh mode, redundancy determination circuit 25 deactivates normal cell area NCA to which normal memory cell NMC that is a source of replacement belongs, and activates redundant cell area RCA to which redundant memory cell RMC that is to be replaced belongs and normal cell area NCA to which normal memory cell NMC that is not being replaced belongs.

14 Claims, 9 Drawing Sheets

SEMICONDUCTOR DEVICE ENABLING REFRESHING OF REDUNDANT MEMORY CELL INSTEAD OF DEFECTIVE MEMORY CELL

This application is based upon and claims the benefit of priority from Japanese Patent Application No. 2010-48818 filed on Mar. 5, 2010, the content of which is incorporated by reference.

BACKGROUND OF THE INVENTION

1. Field of the Invention

The present invention relates to a semiconductor device that simultaneously activates more word lines during a refresh operation than during a normal operation.

2. Description of Related Art

The storage capacities of semiconductor memory devices as typified by a DRAM (Dynamic Random Access Memory) are increasing year by year, and accompanying such increases the area occupied by a single memory cell is being reduced more and more. Consequently, it is difficult to manufacture all the memory cells without any defects, and in practice a large number of defective memory cells are produced in the manufacturing stage. The addresses of defective memory cells are detected by an operation test that is conducted when semiconductor memory devices are in a wafer state, and are written in a non-volatile memory element such as a fuse circuit. Subsequently, when an access is requested to an address of a defective memory cell, an alternate access is made to a redundant memory cell and not to the defective memory cell, and thus the operation to access the relevant address is remedied.

A memory cell of a DRAM comprises one cell capacitor and one cell transistor, and stores information by means of a charge amount stored in the cell capacitor. Charging and discharging with respect to the cell capacitor is controlled by the cell transistor that is connected to a word line. When the cell transistor is turned on, a storage electrode of the cell capacitor is connected to a bit line and thus reading out or writing of information can be performed.

Because a memory cell of a DRAM stores information based on the amount of a charge stored in a cell capacitor in this way, the information will be eliminated by a leak current unless a refresh operation is performed regularly. Thus, it is necessary to refresh all memory cells before the information is eliminated by a leak current, and a cycle (=tREF) at which all memory cells are to be refreshed is defined by the standards as, for example, 64 msec. The standard for this cycle is described in JP2003-187578A.

For many DRAMs, a method is adopted that reduces the frequency of refresh operations by simultaneously activating a larger number of word lines at the time when a refresh operation is performed than at the time when a normal operation is performed. According to this method, at the time when a refresh operation is performed, for example, by disabling the most significant bit of the row address, it is possible to simultaneously activate twice the number of word lines compared to the time when normal access is executed. In this case, how to handle the refresh operation when a refresh address is the address of a defective memory cell is a problem. More specifically, at the time when a refresh operation is performed, for example, since the most significant bit of a row address is disabled, if an alternate access is merely performed in the same way as at the time when a normal operation is performed, even a word line without a defect will be regarded as the source of replacement, and thus the problem will arise in which word lines without a defect will no longer be selected at the time when a refresh operation is performed.

To solve this problem, a method may be considered that activates all word lines that are the source of replacement and that are to be replaced irrespective of whether or not there is a replacement at the time when a refresh operation is performed. However, according to this method, since even defective word lines are activated although there is no need to activate them, there is the problem in which electric current consumption will increase at the time when a refresh operation is performed. Moreover, since it is necessary to enable both an address corresponding to a word line that is the source of replacement and an address corresponding to a word line that is to be replaced, in a case where addresses are divided into a plurality of portions and decoded (predecoded), an unintended word line may be activated.

For example, when a case is considered in which a word line that is not being replaced is selected by means of a first mat address and a first word line address, and a word line that is to be replaced is selected by a second mat address and a second word line address, it is found that the first word line address is enabled with respect to the second mat address and the second word line address is enabled with respect to the first mat address. Thus, a case arises in which two word lines are activated within the same memory mat. In that case, data is destroyed.

Thus, when simultaneously activating more word lines at the time when a refresh operation is performed than at the time when a normal operation is performed, there has been a problem with respect to the method of handling a replacement operation when a refresh address is the address of a defective memory cell or a defective word line.

SUMMARY

In one embodiment, there is provided a semiconductor device that includes a first memory block and a second memory block that each include a normal cell area including a plurality of normal memory cells and a redundant cell area including a plurality of redundant memory cells for replacing a defective memory cell among the normal memory cells; and a redundancy determination circuit that, in response to an event in which the normal memory cell that belongs to at least one memory block from among the first memory block and the second memory block is being replaced by the redundant memory cell in a refresh mode, deactivates a normal cell area to which the normal memory cell that is a source of replacement belongs and activates a redundant cell area to which the redundant memory cell that is to be replaced belongs and a normal cell area to which the normal memory cell that is not being replaced belongs.

In another embodiment, there is provided a semiconductor device that includes a first memory block and a second memory block that are selected according to a first address portion, wherein the first memory block and the second memory block are divided into a plurality of memory mats that each share the same bit line and are selected according to a second address portion, and the plurality of memory mats include a plurality of normal memory cells and a plurality of redundant memory cells that are selected according to a third address portion; and a redundancy determination circuit that, in response to an event in which at least one normal memory cell that is to be accessed is being replaced by a redundant memory cell in a case in which both the first memory block and the second memory block are accessed as a result of disabling the first address portion, inhibits the selection of a normal memory cell belonging to the same memory mat as a redundant memory cell that is to be replaced.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

An exemplary embodiment is described hereunder with reference to the attached drawings.

Figure 1:
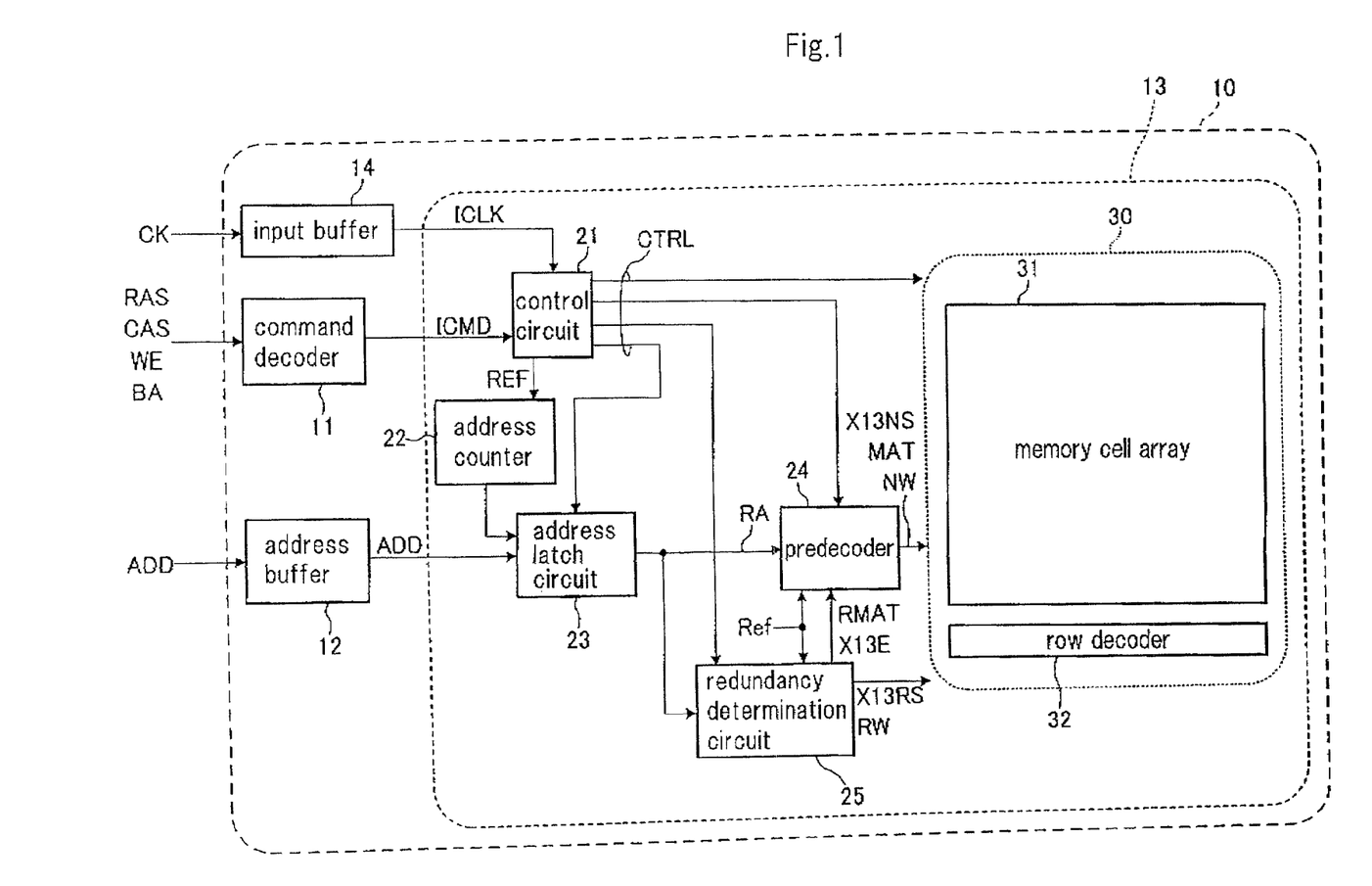
FIG. 1 is a block diagram that illustrates a configuration of a semiconductor device according to an exemplary embodiment.

FIG. 1 is a block diagram that illustrates a configuration of a semiconductor device according to an exemplary embodiment.

As shown in FIG. 1, semiconductor device 10 according to the present exemplary embodiment is configured as a single semiconductor chip, and has command decoder 11, address buffer 12, and at least one memory bank 13 on the same chip. Memory bank 13 comprises control circuit 21, address counter 22, address latch circuit 23, predecoder 24, redundancy determination circuit 25, and memory area 30. Memory area 30 includes at least memory cell array 31 and row decoder 32. Illustration of a column system circuit is omitted from the drawings.

Command decoder 11 receives a RAS (row address strobe) signal, a CAS (column address strobe) signal, a WE (write enable) signal, and bank address BA from outside. In accordance with the combination of the RAS signal, GAS signal, and WE signal, command decoder 11 outputs internal command ICMD to control circuit 21 inside memory bank 13 that is selected by bank address BA.

When the combination of the RAS signal, CAS signal, and WE signal represents a self-refresh operation, a self-refresh command is supplied to control circuit 21 inside all the memory banks. Operations of control circuit 21 are performed in synchrony with internal clock signal ICLK. Internal clock signal ICLK is output from input buffer 14 that receives external clock signal CK.

Address buffer 12 sends address ADD supplied from outside to address latch circuit 23 inside each memory bank 13. Although address ADD includes a row address and a column address, the description according to the present specification focuses on the row address.

Upon receiving internal command ICMD, control circuit 21 generates various control signals CTRL in synchrony with internal clock signal ICLK and outputs control signal CTRL to respective circuit blocks such as address latch circuit 23, predecoder 24, redundancy determination circuit 25, and memory area 30. During a refresh operation, control circuit 21 activates refresh state signal Ref included in control signal CTRL to a high level. Refresh state signal Ref is supplied to predecoder 24 and redundancy determination circuit 25.

Further, when internal command ICMD indicates auto-refresh, control circuit 21 outputs refresh signal REF to address counter 22. When internal command ICMD indicates self-refresh, control circuit 21 periodically outputs refresh signal REF using an oscillator (unshown) inside the control circuit.

Based on refresh signal REF supplied by control circuit 21, address counter 22 counts up or counts down a count value that is used as row address RA. The count value of address counter 22 is output to address latch circuit 23.

Address latch circuit 23 is a circuit that latches row address RA supplied from address buffer 12 or address counter 22 based on one control signal CTRL. Row address RA that is latched at address latch circuit 23 is supplied to predecoder 24 and redundancy determination circuit 25.

Redundancy determination circuit 25 stores redundant addresses that are addresses to be replaced in redundant word lines, and compares row address RA supplied by address latch circuit 23 and a redundant address in response to control signal CTRL. If it is determined as the result of comparison that the two addresses match (that is, a redundancy hit is made), redundancy determination circuit 25 generates redundant block selection signal X1 3RS (=X1 3TRS, X13NRS), redundant mat address RMAT RX12 to RX9), redundant word line selection signal RW, and block enable signal X13E (=X13TE, X13NE). If it is determined as the result of comparison that the two addresses do not match (that is, a redundancy hit is not made), redundancy determination circuit 25 generates block enable signal X13E (=X13TE, X13NE) only.

Redundant block selection signal X13RS is a signal after decoding that corresponds to most significant bit X13 of row address RA, and accordingly has a 2-bit configuration (=X13TRS, X13NRS). Redundant mat address RMAT is a signal before decoding that corresponds to bits X12 to X9 of row address RA, and accordingly has a 4-bit configuration (=RX12 to RX9). Further, redundant word line selection signal RW is a signal after decoding that corresponds to low order bits X8 to X0 of row address RA, and accordingly has a 512-bit configuration. Each of these signals is used for identifying the address of a word line after replacement.

Of these signals, redundant block selection signal X13RS and redundant word line selection signal RW are supplied to row decoder 32, and redundant mat address RMAT and block enable signal X13E are supplied to predecoder 24.

Predecoder 24 carries out a decoding operation based on row address RA supplied from address latch circuit 23, redundant mat address RMAT supplied from redundancy determination circuit 25, and block enable signal X13E, and generates normal block selection signal X13NS (=X13TNS, X13NNS), mat selection signal MAT, and normal word line selection signal NW.

Normal block selection signal X13NS is a signal after decoding that corresponds to most significant bit X13 of row address RA, and accordingly has a 2-bit configuration (=X13TNS, X13NNS). Mat selection signal MAT is a signal after decoding that corresponds to bits X12 to X9 of row address RA, and accordingly has a 16-bit configuration. Further, normal word line selection signal NW is a signal after decoding that corresponds to low order bits X8 to X0 of row address RA, and accordingly has a 512-bit configuration. These signals are supplied to row decoder 32 and are each used for identifying the address of a word line that is not replaced (word line without a defect).

The foregoing is a description of the overall configuration of semiconductor device 10 according to the present exemplary embodiment. In this connection, each memory bank 13 may comprise single address counter 22, or single address counter 22 may be provided for all of memory banks 13.

Figure 2:
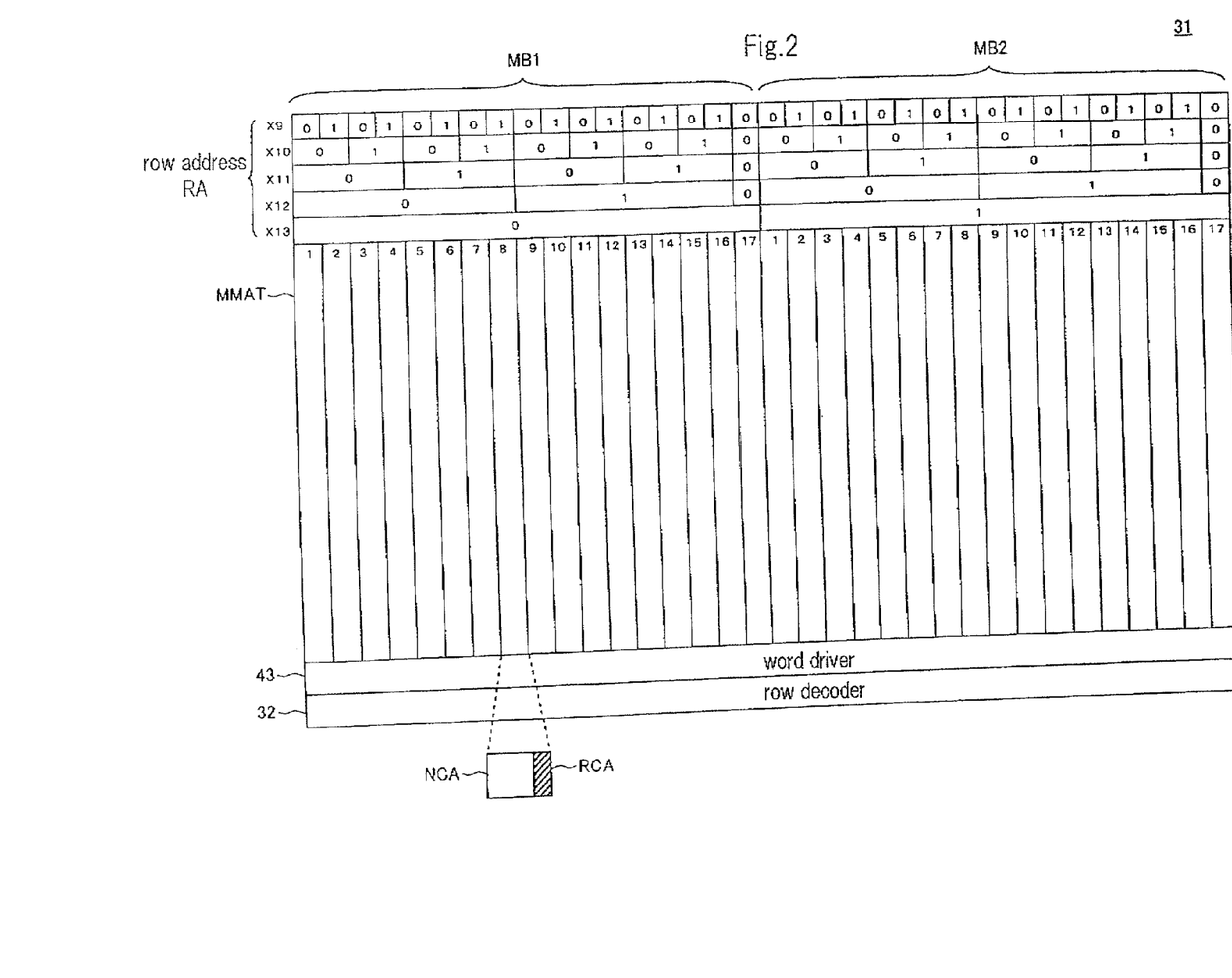
FIG. 2 is a schematic diagram for describing an example of address allocation of a memory cell array in a memory bank shown in FIG. 1.

FIG. 2 is a schematic diagram for describing an example of the address allocation of a memory cell array in the memory bank shown in FIG. 1.

As shown in FIG. 2, memory cell array 31 is divided into two memory blocks MB1 and MB2 (first and second memory blocks) that are distinguished by means of most significant bit X13 of row address signal RA. Memory blocks MB1 and MB2 are each divided into 17 memory mats MMAT that are distinguished by means of bits X12 to X9 of row address RA. In this connection, only half of a bit line included in other memory mats MMAT2 to MMAT16 are provided in memory mats MMAT1 and MMAT17 that are selected when X12 to X9="0000". Accordingly, the total of memory mats MMAT1 and MMAT17 is equivalent to the total of one of the other memory mats. There are 512 word lines provided inside each memory mat, and selection thereof is performed by means of low order bits X8 to X0 of row address RA.

In this case, the term "memory mat" refers to a unit that shares the same bit line. Further, as illustrated in FIG. 2, each memory mat includes normal cell area NCA comprising a plurality of normal memory cells, and redundant cell area RCA comprising a plurality of redundant memory cells for replacing normal memory cells that are defective. However, it is not essential that redundant cell area RCA is included in all memory mats, and a configuration may be adopted that includes memory mats that comprise only normal cell area NCA.

At the time when a normal operation is performed (the time when a read operation is performed and the time when a write operation is performed), all bits of row address RA are enabled. As a result, one of the word lines included in memory cell array 31 is activated. In contrast, at the time when a refresh operation is performed, most significant bit X13 of row address RA is disabled. Therefore, one word line from among the word lines included in memory block MB1 and one of the word lines included in memory block MB2 are simultaneously activated.

Figure 3:
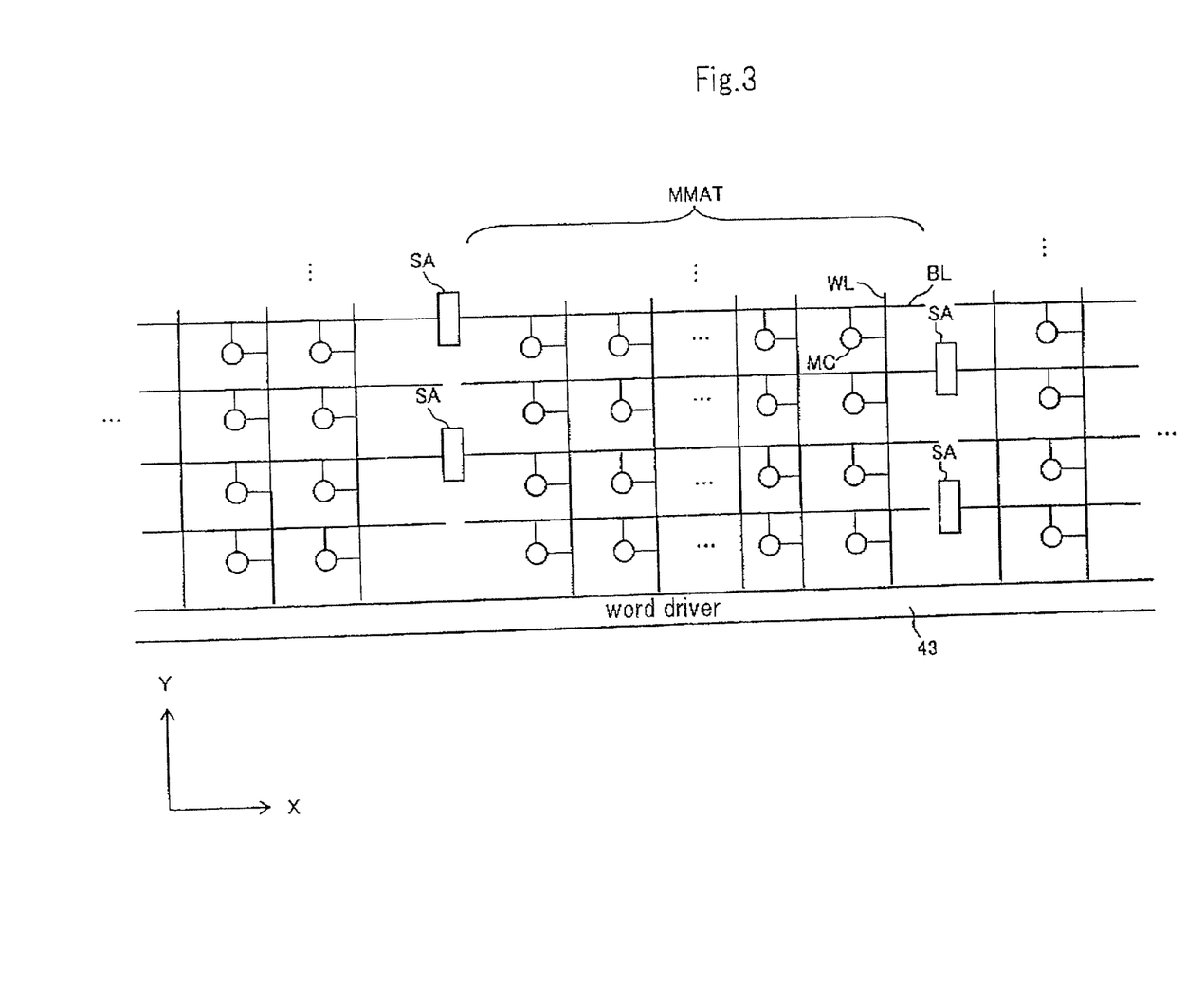
FIG. 3 is a circuit diagram that illustrates a portion of the memory cell array shown in FIG. 1 in an enlarged fashion.

FIG. 3 is a circuit diagram that illustrates a portion of the memory cell array shown in FIG. 1 in an enlarged fashion.

As shown in FIG. 3, memory cell array 31 has a plurality of word lines WL that extend in the Y direction, a plurality of bit lines BL that extend in the X direction, and memory cells MC arranged at points of intersection between word lines WL and bit lines BL. In this exemplary embodiment, memory cells MC are DRAM cells and comprise a series circuit of a cell transistor and a cell capacitor. A gate electrode of the cell transistor is connected to word line WL, and a source or drain of the cell transistor is connected to a corresponding bit line BL.

Word lines WL are connected to word driver 43 that extends in the X direction. One word line from among word lines WL is activated based on output of row decoder 32. Bit lines BL are connected to sense amplifiers SA that are arranged in the Y direction. Sense amplifiers SA are also activated based on a row address. Although not shown in the drawings, sense amplifiers SA are connected to data wiring through a column switch. Selection of a column switch is performed based on a column address.

Figure 4:
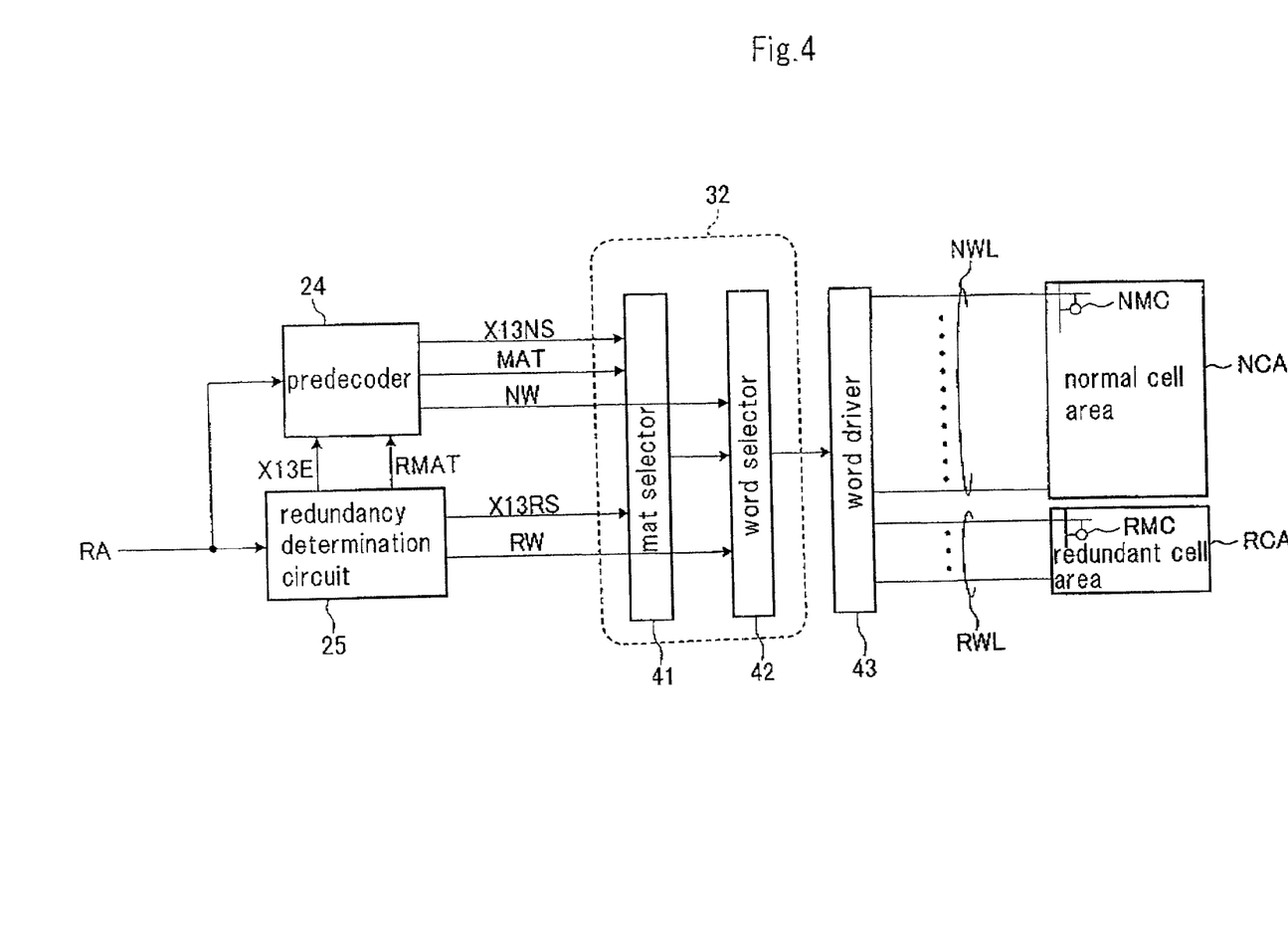
FIG. 4 is a block diagram that illustrates circuits relating to a row address in a manner in which the circuits are extracted from the semiconductor device.

FIG. 4 is a block diagram that illustrates circuits relating to row addresses in a manner in which the circuits are extracted from the semiconductor device.

As described previously, row address RA is supplied to predecoder 24 and redundancy determination circuit 25, and various signals are generated by predecoder 24 and redundancy determination circuit 25 based on the supplied row address RA Normal block selection signal X13NS, redundant block selection signal X13RS, mat selection signal MAT, normal word line selection signal NW, and redundant word line selection signal RW generated by predecoder 24 and redundancy determination circuit 25 are supplied to row decoder 32. Among these signals supplied to row decoder 32, block selection signals X13NS and X13RS for selecting memory blocks MB1 and MB2 are divided into a signal for normal access (X13NS) and a signal for redundant access (X13RS).

In contrast, mat selection signal MAT for selecting memory mat MMAT is supplied to row decoder 32 in a condition in which a signal for normal access and a signal for redundant access are in a mixed state. The term "mixed state" refers to a state in which both a bit for normal access and a bit for redundant access are activated. Naturally, word line selection signals NW and RW for selecting a word line are divided into a signal for normal access (NW) and a signal for redundant access (RW).

As shown in FIG. 4, row decoder 32 includes mat selector 41 and word selector 42. Normal block selection signal X13NS, redundant block selection signal X13RS, and mat selection signal MAT are supplied to mat selector 41. Further, an output signal of mat selector 41, normal word line selection signal NW, and redundant word line selection signal RW are supplied to word selector 42.

An output signal of word selector 42 is supplied to word driver 43, and corresponding word line WL is activated thereby. Word lines WL comprise normal word lines NWL and redundant word lines RWL. When there is a defect in any normal word line NWL (including a case in which even though there is no defect in the word line itself, there is a defect in any memory cell MC connected thereto), redundant word line RWL is used to replace the defective normal word line NWL. Normal word line NWL is used for selecting normal memory cell NMC that belongs to normal cell area NCA. Redundant word line RWL is used for selecting redundant memory cell RMC that belongs to redundant cell area RCA.

Figure 5:
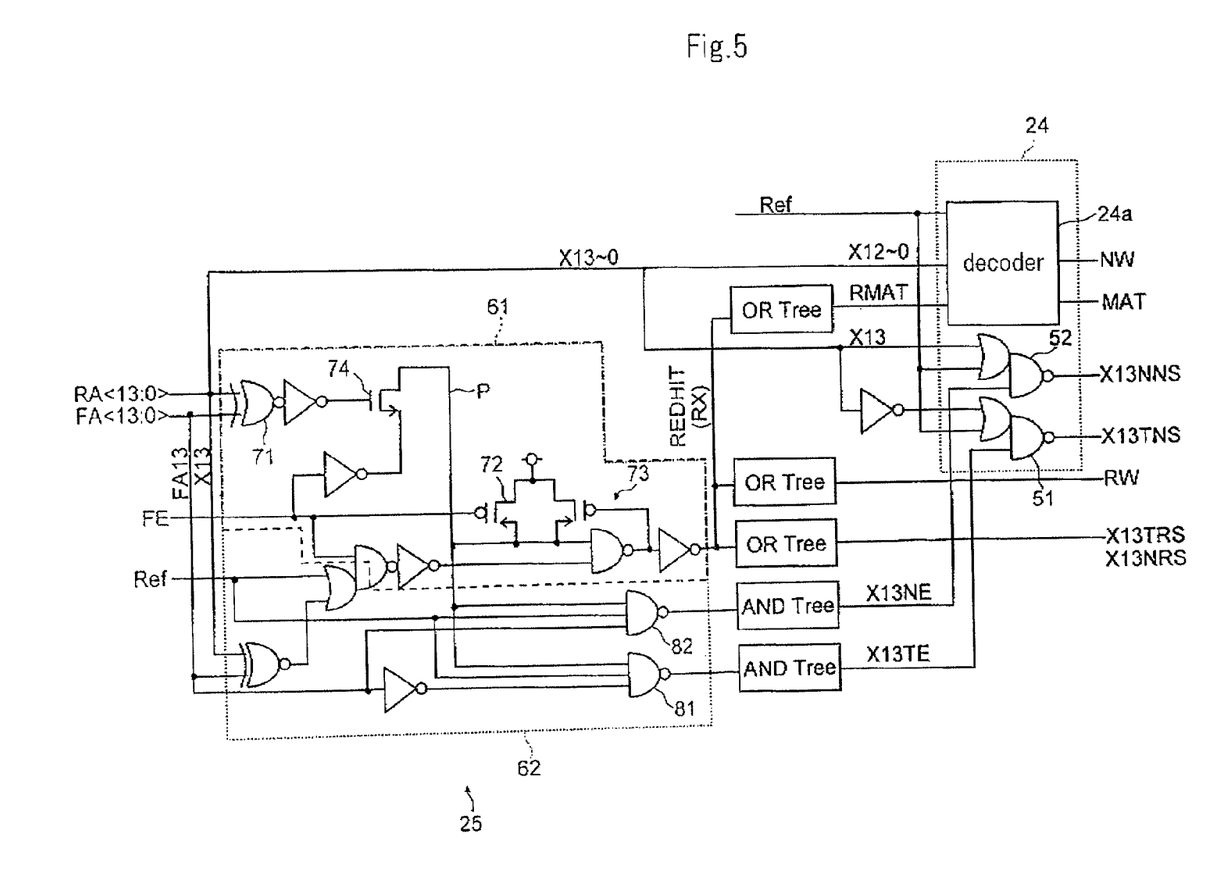
FIG. 5 is a circuit diagram that illustrates an example of a predecoder and a redundancy determination circuit shown in FIG. 4.
Figure 6:
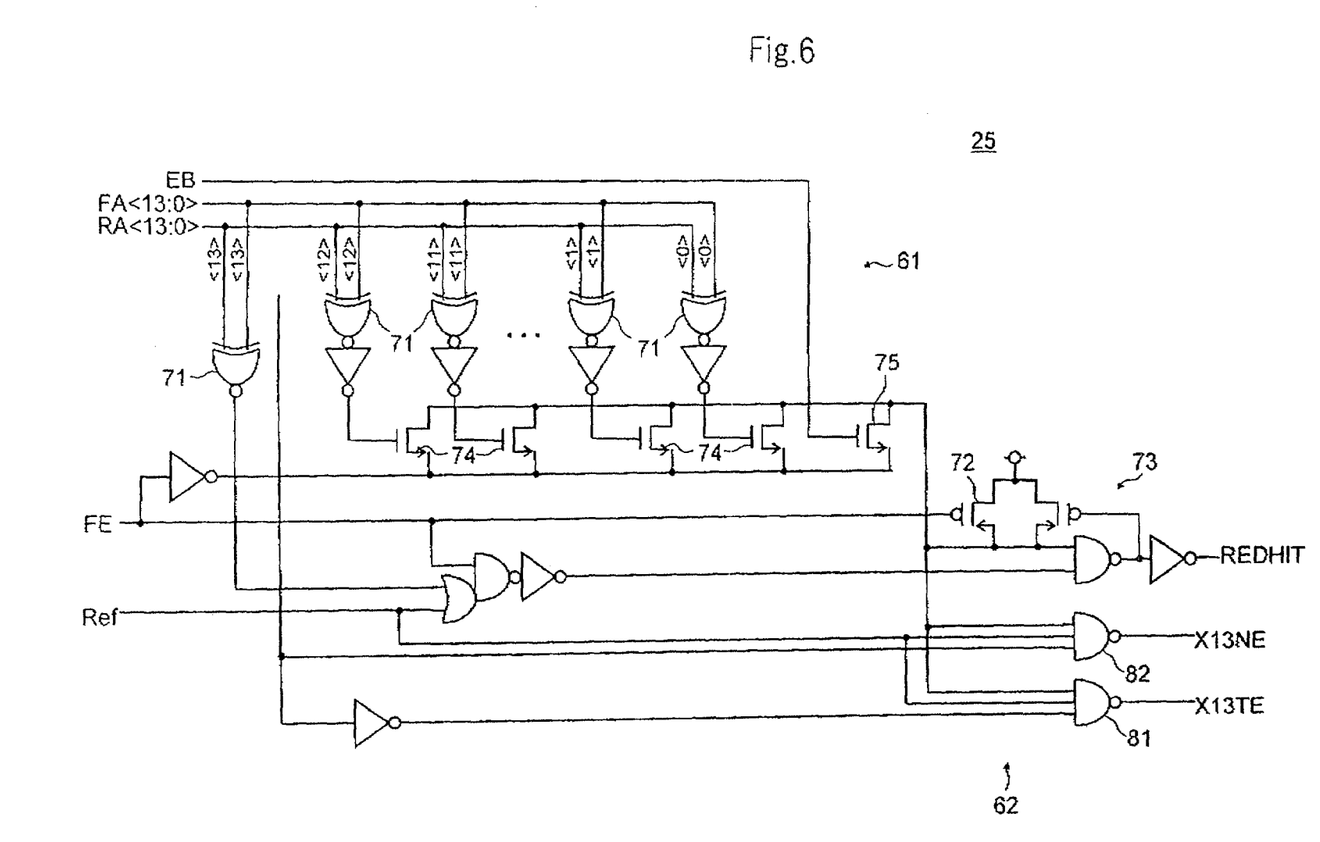
FIG. 6 is a circuit diagram that illustrates an example of the redundancy determination circuit in further detail.

FIG. 5 is a circuit diagram that illustrates an example of the predecoder and the redundancy determination circuit shown in FIG. 4. FIG. 6 is a circuit diagram that illustrates an example of the redundancy determination circuit in further detail.

As shown in FIG. 5, all bits X13 to X0 of row address RA are supplied to predecoder 24. Among these, most significant bit X13 is supplied to complex gates 51 and 52. Complex gate

51 is a logic gate circuit that receives an inverted signal of most significant bit X13, block enable signal X13TE, and refresh state signal Ref. The output of complex gate 51 is used as normal block selection signal X13TNS. Complex gate 52 is a logic gate circuit that receives most significant bit X13, block enable signal X13NE, and refresh state signal Ref. The output of complex gate 52 is used as normal block selection signal X13NNS.

In this case, refresh state signal Ref is a part of control signal CTRL shown in FIG. 1, and is activated to high level at the time when a refresh operation is performed. At the time when a normal operation is performed (the time when a read operation is performed and the time when a write operation is performed), refresh state signal Ref is deactivated to a low level.

According to this configuration, when a state is assumed in which both of block enable signals X13TE and X13NE are activated to a high level, it is found that, in that state, either normal block selection signal X13TNS or normal block selection signal X13NNS is activated at the time when a normal operation is performed, and both of normal block selection signal X13TNS and normal block selection signal X13NNS are activated at the time when a refresh operation is performed. This means that most significant bit X13 is disabled at the time when a refresh operation is performed.

With regard to the other bits, namely, X12 to X0, of row address RA, bits X12 to X0 are divided into high order bits X12 to X9 and low order bits X8 to X0 by decoder 24a. A result obtained by decoding high order bits X12 to X9 is output as mat selection signal MAT, and a result obtained by decoding low order bits X8 to X0 is output as normal word line selection signal NW. When bit signal REDHIT is activated, decoder 24a inhibits activation of normal word line selection signal NW. Thus, when normal word line NWL that is to be accessed in a normal operation mode is replaced by redundant word line RWL, activation of normal word line NWL that is the replacement origin is inhibited.

Refresh state signal Ref is also supplied to decoder 24a. When refresh state signal Ref is activated, even if bit signal REDHIT has been activated, decoder 24a activates normal word line selection signal NW.

Redundancy determination circuit 25 includes address determination section 61 and enable signal generator 62. Although only one set of address determination section 61 and enable signal generator 62 is illustrated in FIG. 5, in practice a number of sets comprising address determination section 61 and enable signal generator 62 that is equal to the number of redundant word lines RWL is required. That is, it is necessary to assign a single set of address determination section 61 and enable signal generator 62 to a single redundant word line RWL.

The outputs from the plurality of address determination sections 61 are combined by means of an OR-tree for each portion that selects memory blocks MB1 and MB2, each portion that selects memory mat MMAT, and each portion that selects redundant word line RWL, and the outputs thereof are supplied to mat selector 41 (see FIG. 4), predecoder 24, and word selector 42, respectively. The outputs from the plurality of enable signal generators 62 are combined (X13TE and X13NE) by means of an AND-tree for each portion that enables memory block MB1 and each portion that enables memory block MB2, and the outputs thereof are supplied to complex gates 51 and 52, respectively.

As shown in FIG. 5, address determination section 61 includes bit comparator 71 that compares row address RA (X13 to X0) to which access has been requested and fuse data (FA13 to FA0) held in an unshown address storage circuit for each bit, precharge transistor 72 that precharges precharge line P when fuse enable signal FE becomes a law level, latch circuit 73 that holds a precharge state of precharge line P, and discharge transistor 74 that discharges precharge line P in accordance with the output of bit comparator 71. In practice, as shown in FIG. 6, bit comparator 71 and discharge transistor 74 are respectively provided for each bit, and enable transistor 75 to which enable bit EB is supplied is also provided.

According to this configuration, since all discharge transistors 74 enter an "off" state only if all bits of row address RA (X12 to X0) and fuse data (FA12 to FA0) completely match, even if fuse enable signal FE changes to a high level, precharge line P will be maintained in a precharge state. Accordingly, if most significant bit X13 and FX13 match, bit signal REDHIT will be activated.

Bit signal REDHIT is a signal for generating redundant address RX (=RX13 to RX0). Redundant address RX (=RX13 to RX0) generated by bit signal REDHIT is selected so that at least the mat address is different with respect to row address RA (X13 to X0) that is the source of replacement. Therefore, at both the time when a normal operation is performed and the time when a refresh operation is performed, the memory mat that is the source of replacement and the memory mat that is to be replaced do not match. In other words, a normal cell area that is not being replaced and a redundant cell area belonging to the same memory mat are necessarily deactivated.

Further, most significant bit RX13 of a redundant address generated by bit signal REDHIT can be designated irrespective of most significant bit X13 of row address RA that is the source of replacement. More specifically, regardless of whether normal word line NWL that is the source of replacement belongs to memory block MB1 or to memory block MB2, redundant word line RWL belonging to memory block MB1 and redundant word line RWL belonging to memory block MB2 can each be designated as a redundant word line that is to be replaced. Thus, the probability of repairing a defective address is improved.

In contrast, when row address RA (X12 to X0) and the fuse data (FA12 to FA0) differ by even one bit, at least one discharge transistor 74 will be in an "on" state. Hence, precharge line P is discharged when fuse enable signal FE changes to a high level.

Enable signal generator 62 includes NAND gates 81 and 82. NAND gate 81 receives a level of precharge line P, refresh state signal Ref, and an inverted signal of most significant bit FA13 of the fuse data, and generates block enable signal X13TE. Likewise, NAND gate 82 receives a level of precharge line P, refresh state signal Ref, and most significant bit FX13 of the fuse data and generates block enable signal X13NE. According to this configuration, with regard to memory blocks MB1 and MB2 on a side on which a match is detected by address determination section 61 at the time when a refresh operation is performed, the corresponding block enable signal X13TE or X13NE is set to a low level. When block enable signal X13TE or X13NE becomes a low level, the corresponding normal block selection signal X13TNS or X13NNS is forcibly deactivated.

Figure 7:
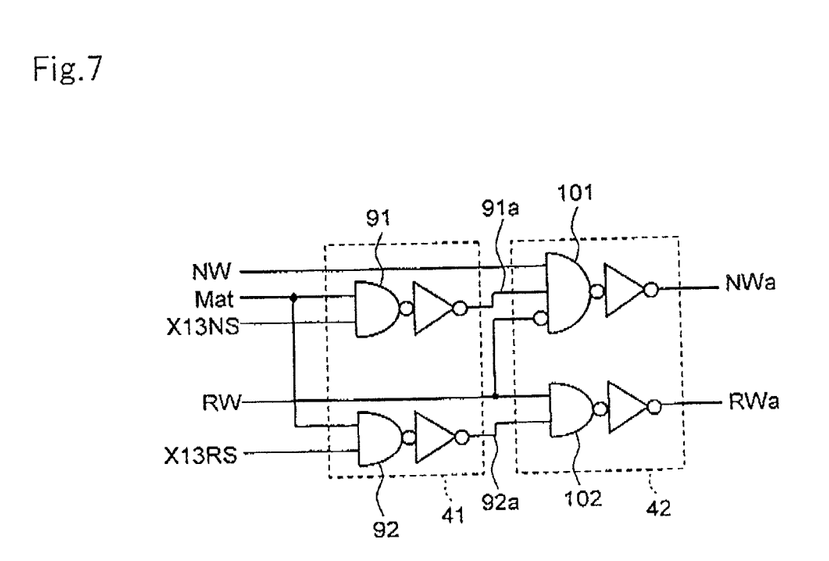
FIG. 7 is a circuit diagram that illustrates an example of a row decoder shown in FIG. 1, which has been simplified for the purpose of description.

FIG. 7 is a circuit diagram that illustrates an example of the row decoder shown in FIG. 1, which has been simplified for the purpose of description.

The illustration of mat selector 41 shown in FIG. 7 includes only a circuit portion corresponding to one mat, and the illustration of word selector 42 L0 shown in FIG. 7 includes only a circuit portion corresponding to one normal word line NWL and one redundant word line RWL. Accordingly, in practice there are a large number of these circuit portions in the row decoder. That is, respective mat selectors 41 are assigned to each memory mat, and a plurality of word selectors 42 are assigned with respect to single mat selector 41.

As shown in FIG. 7, mat selector 41 includes AND gate 91 into which a corresponding mat selection signal MAT and a corresponding normal block selection signal X13NS (X13TNS or X13NNS) are input, and AND gate 92 into which a corresponding mat selection signal MAT and a corresponding redundant block selection signal X13RS (X13TRS or X13NRS) are input.

Word selector 42 includes AND gates 101 and 102. A corresponding normal word line selection signal NW, a corresponding output signal 91*a* of AND gate 91, and an inverted signal of corresponding redundant word line selection signal RW are input to AND gate 101, and the output thereof is used as normal word line selection signal NWa. Normal word line selection signal NWa is supplied to word driver 43, and is used as a signal that selects a corresponding normal word line NWL.

On the other hand, a corresponding redundant word line selection signal RW and output signal 92*a* of corresponding AND gate 92 are input to AND gate 102, and the output thereof is used as redundant word line selection signal RWa. Redundant word line selection signal RWa is supplied to word driver 43, and is used as a signal that selects a corresponding redundant word line RWL.

According to this configuration, when redundant word line selection signal RW is activated, normal word line selection signal NW belonging to the relevant memory mat MMAT is forcibly deactivated.

The foregoing describes the configuration of semiconductor device 10 according to an exemplary embodiment. Next, operations of semiconductor device 10 according to the present exemplary embodiment are described.

Figure 8:
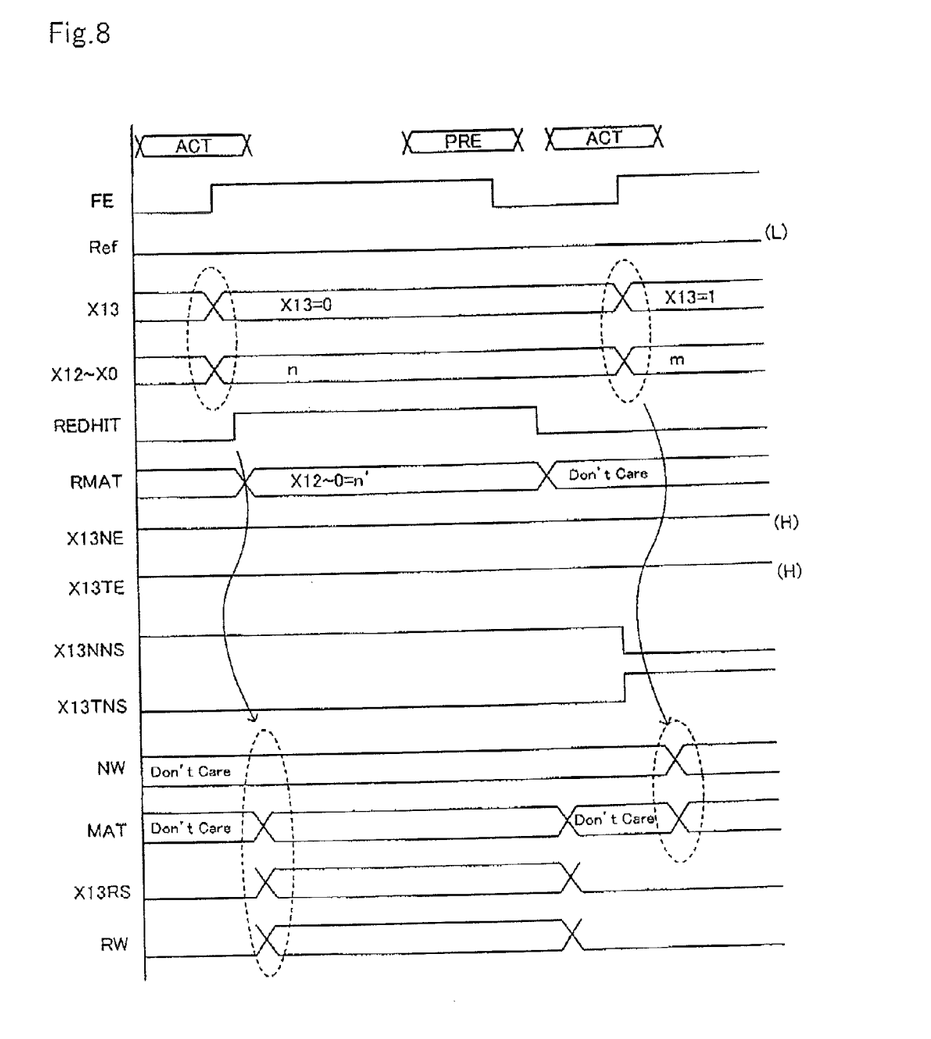
FIG. 8 is a timing chart for describing operations of the semiconductor device at the time when a normal operation is performed.

FIG. 8 is a timing chart for describing operations of semiconductor device 10 at the time when a normal operation is performed. The example shown in FIG. 8 illustrates a case is in which row address RA that has been input in response to a first active command (ACT) is an address of a defective word line. In this case, bit signal REDHIT activates in response to the input of row address RA, and redundant word line selection signal RW activates instead of normal word line selection signal NW. Normal word line selection signal NW enters a "don't care" state.

Figure 9:
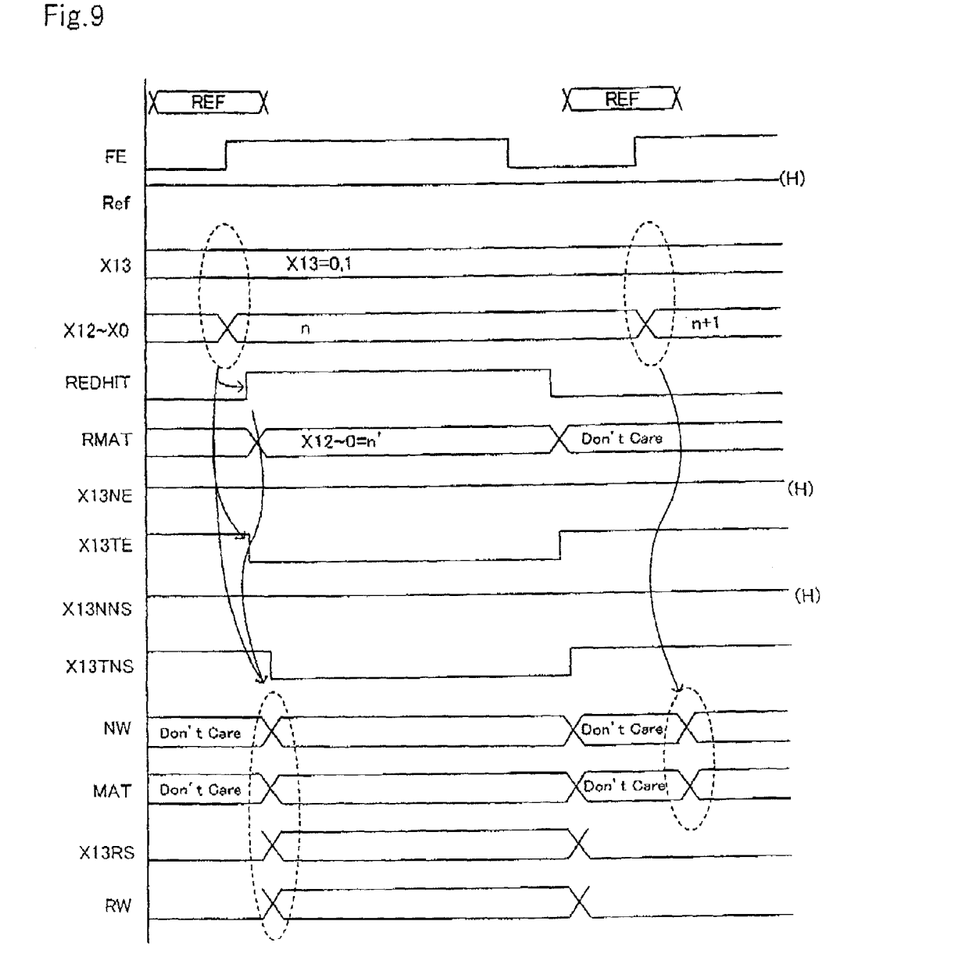
FIG. 9 is a timing chart for describing operations of the semiconductor device at the time when a refresh operation is performed.

FIG. 9 is a timing chart for describing operations of semiconductor device 10 at the time when a refresh operation is performed.

The example shown in FIG. 9 illustrates a case in which row address RA supplied by address counter 22 in response to a first refresh command (REF) is the address of a defective word line in memory block MB1 (X13=0 side). In this case, since block enable signal X13TE corresponding to memory block MB1 changes to a low level, normal block selection signal X13TNS is deactivated. Instead, redundant block selection signal X13TRS or X13TRS that shows a memory block to which redundant word line RWL that is to be replaced belongs is activated. As a result, the memory block to which the redundant word line that is to be replaced belongs and the memory block to which the normal word line NWL that is not being replaced belongs are activated.

At this time, activation of all normal word lines NWL is inhibited in the memory block in which the redundant word line that is to be replaced belongs. Therefore, for example, in a case in which normal word line NWL that belongs to memory block MB1 is replaced by redundant word line RWL that belongs to memory block MB2, because both normal block selection signal X13TNS and redundant block selection signal X13TRS are deactivated, all mat selectors 41 assigned to memory block MB1 are deactivated and no accesses are performed to memory block MB1.

As described above, according to the semiconductor device of the present exemplary embodiment, at a time of a refresh operation, because normal word line NWL that is a source of replacement (that is, a word line that selects a normal memory cell that has a defect) is deactivated, it is possible to prevent the occurrence of wasteful electric current consumption. Moreover, at the time when a refresh operation is performed, because activation of a normal word line belonging to the same memory mat as redundant word line RWL that is to be replaced (that is, a word line that selects a redundant memory cell) is inhibited, it is possible to prevent destruction of data due to the refresh operation.

It is apparent that the present invention is not limited to the above embodiments, but may be modified and changed without departing from the scope and spirit of the invention.

What is claimed is:

1. A semiconductor device, comprising:
   a first memory block and a second memory block each having a normal cell area including a plurality of normal memory cells and a redundant cell area including a plurality of redundant memory cells for replacing a defective memory cell among the normal memory cells; and
   a redundancy determination circuit that, in response to an event in which a normal memory cell that belongs to at least one memory block from among the first memory block and the second memory block is being replaced by the redundant memory cell in a refresh mode, receives a row address corresponding to a source of the replacement, compares the row address with a fuse data, generates a redundancy signal based on the comparison, and deactivates a normal cell area to which the normal memory cell that is the source of replacement belongs based on the redundancy signal generated using a result of the comparison between the row address and the fuse data and activates a redundant cell area to which the redundant memory cell that is to be replaced belongs and a normal cell area to which the normal memory cell that is not being replaced belongs based on the redundancy signal.

2. The semiconductor device according to claim 1, wherein:
   the first memory block and the second memory block are each divided into a plurality of memory mats that respectively include the normal cell area and the redundant cell area;
   the plurality of memory mats are each a unit that shares a same bit line; and
   the redundancy determination circuit deactivates a normal cell area belonging to a same memory mat as a redundant cell area to which the redundant memory cell that is to be replaced belongs.

3. The semiconductor device according to claim 2, wherein the redundancy determination circuit deactivates a redundant cell area belonging to a same memory mat as a normal cell area to which the normal memory cell that is not being replaced belongs.

4. The semiconductor device according to claim 1, wherein regardless of whether the normal memory cell that is a source of replacement belongs to the first memory block or to the second memory block, a redundant memory cell belonging to the first memory block and a redundant memory cell belonging to the second memory block can each be designated as a redundant memory cell that is to be replaced.

5. The semiconductor device according to claim 1, wherein in a normal operation mode in which either the first memory block or the second memory block is accessed, in response to an event in which the normal memory cell that is to be accessed is being replaced by the redundant memory cell, the redundancy determination circuit deactivates the normal cell area to which the normal memory cell that is the source of replacement belongs and activates the redundant cell area to which the redundant memory cell that is to be replaced belongs.

6. The semiconductor device according to claim 1, wherein in the refresh operation, a word line in the normal cell area of the first memory block and a word line in the normal cell area of the second memory block are activated simultaneously.

7. The semiconductor device according to claim 1, wherein the word line in the normal cell area of the first memory block and the word line in the normal cell area of the second memory block are activated simultaneously by disabling the most significant bit of the row address.

8. The semiconductor device according to claim 1, wherein the redundancy determination circuit deactivates a normal word line of the normal cell area to which the normal memory cell that is the source of replacement belongs and activates a redundant word line of the redundant cell area to which the redundant memory cell that is to be replaced belongs based on the redundancy signal.

9. The semiconductor device according to claim 1, wherein the redundancy determination circuit deactivates all normal word lines of the normal cell area to which the normal memory cell that is the source of replacement belongs.

10. A semiconductor device, comprising:
a first memory block and a second memory block that are selected according to a first address portion of a row address, wherein:
the first memory block and the second memory block are divided into a plurality of memory mats that each share a same bit line and are selected according to a second address portion of the row address, and
the plurality of memory mats include a plurality of normal memory cells and a plurality of redundant memory cells that are selected according to a third address portion of the row address;
the semiconductor device further comprising:
a redundancy determination circuit that, during a refresh operation, disables the first address portion of the row address, and in response to an event in which at least one normal memory cell that is to be accessed is being replaced by a redundant memory cell in a case in which both the first memory block and the second memory block are accessed as a result of disabling the first address portion the row address, inhibits a selection of a normal memory cell belonging to a same memory mat as the redundant memory cell that is to be replaced after the first address portion of the row address is disabled, by deactivating all word selectors that select the normal memory cell belonging to the same memory mat as the redundant memory cell that is to be replaced during the refresh operation.

11. The semiconductor device according to claim 10, wherein the redundant memory cell that is to be replaced belongs to a different memory mat than a normal memory cell that is a source of replacement.

12. The semiconductor device according to claim 10, wherein when both the first memory block and the second memory block are accessed as a result of disabling the first address portion, the redundancy determination circuit inhibiting an access to the normal memory cell that is the source of replacement.

13. The semiconductor device according to claim 10, further comprising:
a predecoder that generates a corresponding memory mat selection signal based on the second address portion, and generates a corresponding word line selection signal based on the third address portion;
a plurality of mat selectors that are activated according to a corresponding memory mat selection signal, respectively; and
a plurality of word selectors that are activated according to an output of the mat selector that is corresponding to selected memory mat and according to a corresponding word line selection signal, respectively.

14. The semiconductor device according to claim 10, wherein when a normal memory cell belonging to the first memory block is being replaced by a redundant memory cell belonging to the second memory block in a case where both the first memory block and the second memory block are accessed as a result of disabling the first address portion, the redundancy determination circuit deactivates all mat selectors assigned to the first memory block.

* * * * *